United States Patent [19]
Yamaguchi et al.

[11] Patent Number: 5,545,484
[45] Date of Patent: Aug. 13, 1996

[54] HEAT AND OXIDATION RESISTIVE HIGH STRENGTH MATERIAL AND ITS PRODUCTION METHOD

[75] Inventors: Shizuka Yamaguchi, Hitachinaka; Yoshitaka Kojima, Hitachi; Sai Ogawa, Ibaraki-ken; Hideyuki Arikawa, Hitachi; Mitsuo Haginoya, Ibaraki-ken; Yukihiko Wada; Kyozo Iwao, both of Hitachi, all of Japan

[73] Assignee: Hitachi, Ltd., Tokyo, Japan

[21] Appl. No.: 351,705

[22] Filed: Dec. 8, 1994

[30] Foreign Application Priority Data

Dec. 8, 1993 [JP] Japan ................................. 5-308026

[51] Int. Cl.⁶ .......................... C23C 14/08; C23C 14/22; C04B 41/90
[52] U.S. Cl. .......................... 428/408; 428/697; 428/698; 428/699; 428/701; 428/702; 428/469
[58] Field of Search .................... 428/408, 469, 428/697, 698, 699, 701, 702

[56] References Cited

U.S. PATENT DOCUMENTS 4,828,934  5/1989  Pinkhasov ................. 428/698
5,051,300  9/1991  Rousseau ................... 428/408

FOREIGN PATENT DOCUMENTS 0229522  7/1987  European Pat. Off. .
0359614  3/1990  European Pat. Off. .

OTHER PUBLICATIONS

Patent Abstracts of Japan, vol. 164, No. 31, 9 Sep. 1992 & JP-A-04 149 083.
Database WPI, Section CH, Week 7829, 14 June 1978 Derwent Publications & JP-A-53 066 889.
Chemical Abstracts, vol. 119, No. 12, 20 Sep. 1993, p. 429.
Chemical Abstracts, vol. 116, No. 2, 13 Jan. 1992, p. 221.
Chemical Abstracts, vol. 118, No. 26, 28 Jun. 1993, p. 345.
Ceramic Engineering And Science Proceedings, vol. 10, No. 9/10, Oct. 1989, pp. 1440–1445 N. Sugiyama, et al. "Metallization of Ceramics by IVD System".

*Primary Examiner*—A. A. Turner
*Attorney, Agent, or Firm*—Antonelli, Terry, Stout & Kraus

[57] ABSTRACT

A heat and oxidation resistive high strength material utilized in structural body parts subject to bleaching in high temperature/oxidative atmosphere, the body structure of a space vehicle, a combustor, the combustor for a gas turbine, a turbine blade, and a turbine nozzle, is presented. A method for producing this heat and oxidation resistive high strength material is also explained.

41 Claims, 6 Drawing Sheets

HEAT AND OXIDATION RESISTIVE HIGH STRENGTH MATERIAL AND ITS PRODUCTION METHOD

BACKGROUND OF THE INVENTION

The present invention relates to a heat and oxidation resistive high strength material used in structural body pans subject to bleaching in high temperature/oxidative atmosphere, the body structure of an orbital space plane, a combustor, the combustor for a gas turbine, a blade, and a nozzle; the present invention also relates to a method for producing the heat and oxidation resistive high strength material.

Concerning the fields in energy, material production process, and spacecraft, developments in the heat resistive materials having thermal insulation, heat resistance, and excellent resistance to environmentally induced damages are cited as important technical topics for materials used under extreme environmental circumstances.

As heat resistive materials there are metallic materials, composite materials, and ceramics to name a few. As far as heat resistive alloy is concerned, there is a super alloy which has Ni, Co, and Fe as the constituent bases. However, Ni, the main constituent of a Ni-based super alloy, has a melting point of 1455° C., and therefore, this alloy cannot be used in an environment with temperature range that goes beyond this point. For this reason, an environmentally induced damage insulation layer is formed on the surface of this alloy. As one of the representative examples, a thermal barrier coating (TBC) method is presented which involves spraying melted ceramics of $ZrO_2$ and $Y_2O_3$ into the middle layer of a super alloy, produced with the purposes of relaxing thermal stress, improving adhesion, enhancing oxidation resistance, and improving anti-corrosion at the surface. Furthermore, JPA62-156938 describes a functionally gradient material (FGM) which relaxes thermal stress by having the composition ratio of $ZrO_2$ and $Y_2O_3$ change continuously at the middle layer between the substrate and the ceramics.

There are others such as an intermetallic compound and a high melting point metal. Some of the intermetallic compounds as a heat resistive structure are Al compounds of iron family (Fe, Ni, Co) and Ti, but these compounds leave some room for improvement in terms of hardness, workability, and resistive to oxidation. On the other hand, the high melting point metals of W, Mo, Nb, Ta etc., have high thermal conduction and has good resistance against heat but has a weakness of being abraded easily by oxidation; and therefore, there is a need to develop an alloy having strength and resistance to oxidation or a surface process which imparts these characteristics.

Moreover, there are composite materials which have heat resistancy and high strength. Composite materials having high strength fibers at a high temperature range improve the strength of matrix materials at a high temperature range. In terms of matrix types there are fiber reinforced plastics (FRP), fiber reinforced metals (FRM), fiber reinforced ceramics (FRC), and carbon fiber reinforced carbons (CFRC). Limit on the highest usable temperature depends on the type of matrix used. For the plastic type, the temperature is 300° C.; for the metal type, 1300° C.; for the ceramic type, 1800° C.; and for the carbon type, 3000° C. approximately. Specifically, the density of the CFRC is less than 2.0 and the strength of this material does not deteriorate until over 300° C.; the material is known as a super heat resistive material for retaining excellent strength and excellent hardness at high temperatures. However, since the CFRC is made of carbon only, in the oxidative atmosphere of around 500° C., oxidative abrasion becomes noticeable. Therefore, this material cannot be used at temperatures above 500° C. in an environment of oxidative atmosphere. Therefore, in order to use the CFRC even in such an environment, an anti-oxidation treatment becomes necessary. That is, the determining factor of the usable heat resistive temperature of the CFRC in the oxidative atmosphere is the durability of the anti-oxidation treatment. An example of the anti-oxidation treatment is an anti-oxidation coating formed on the substrate surface.

One of the main coating elements of the anti-oxidation coating is SiC. For forming SiC, there are a chemical vapor reaction (CVR) method or a chemical vapor deposition (CVD) method. The CVR method involves diffusing metallic silicon vapor into the substrate and reacting with the carbons in the substrate to form SiC. Passages are required for producing this reaction, and because holes are very difficult to get rid of, the coating is left with many holes. In the oxidative atmosphere, oxygen enter into the substrate through these holes and cause damages, and therefore, there is the oxidation problem. Since the CVD method involves forming a coating by depositing a coating at the atomic level, SiC with very high purity and a very fine crystal structure can be formed. However, since the expansion coefficient of the CFRC is small (0 to $1\times10^{-6}$/°C.), microcracks form across the thickness of the coating by thermal stress caused by the differences in thermal expansion. Through these microcracks, oxygen of the oxidative atmosphere enter to cause damages to the substrate. Therefore, microcracks must be sealed, and this is done by tetraethyl orthosilicate (TEOS), for example, which impregnates into the microcracks of SiC to seal it; this process is described in Spacecraft Technical Research Report TR-946, "Trial Product Test of Carbon Composite Combustor for Low Thrust Storage Propulsion Chemical Engine" (October, 1987), or The Third Symposium for the Advances in Environmentally Induced Damage Super Resistant Materials, "Petroleum Pitch Type C/C Composite Material Composite Formation and Anti-Oxidation Technology" (October, 1987).

For an anti-oxidation coating of greater temperature range (2000° C.), two layer coatings of Ir and $Al_2O_3$, placed on top of Ir, are formed on the C/C material surface by a sputtering deposition instrument. However, this coating is subject to cracks when the temperature is made to rise to and fall from the high temperature range, and therefore, a sealing process is required (described in The Third Symposium for the Advances in Environmentally Induced Damage Super Resistant Materials, "Petroleum Pitch Type C/C Composite Material Composite Formation and Anti-Oxidation Technology" (October, 1987)). Therefore, it is necessary to examine the sealing materials and the process methods for maintaining anti-oxidation property in the 2000° C. range.

On the other hand, as a method of other formation of the anti-oxidation surface of the C/C material, a material of metallic layers consisting of a hafnium, tantalum or zirconium foil between the rhenium or silicon carbite layers is described in JPA1-23048 No. 7 of "Heat and Oxidation Resistive Reinforced Material and its Production Method." The anti-oxidation coating layer of this materials reacts, in the oxidative atmosphere at 2000° C., under certain combination of materials to produce products that possibly lower the anti-oxidation property. Also, high temperature anti-resistive carbon materials having a silicon carbite film formed on top of the carbon substrate, and Hf and Zr metal films formed on top of the silicon carbite film, and an Ir film formed on top of this is disclosed in JPA4-149083.

According to the known technologies of the above, it would be difficult to obtain light and strong materials in the 2000° C. range. That is, it became evident that a carbon fiber reinforced carbon as a highly strong material does not have adequate heat and oxidation resistivity in the oxidative atmosphere at the 2000° C. range. SiC, which is used often as a heat and oxidation resistive coating layer formed on the substrate surface, is oxidized to $SiO_2$ in the high temperature range, and higher the temperature, more of this product forms. Additionally, as heating and cooling is repeated, the oxidized coating of $SiO_2$ is subject to peeling and therefore, durability cannot be achieved. Furthermore, if the temperature goes above 1700° C., $SiO_2$ melts, and in the case of materials on the body of a spacecraft which receives bombardment on the surface, the melted material scatters and the abrasion becomes noticeable. Therefore, the limit on the usable temperature of SiC as a heat and oxidation resistive coating layer is 1700° C.

Additionally, as an easily accessible technology, there is a plasma flame coating method for forming high melting point ceramics. By this method, even if a high melting point ceramics layer or a metal layer is formed on the carbon fiber reinforced carbon substrate, there are cases in which cracks or peeling occurs after the formation of the layer or when the layer receives thermal shocks because of the differences in the expansion coefficients between the layer and the substrate or a lack of good adhesion between the two. In these kinds of situation, the substrate oxidizes and is subject to abrasion, and the layer ceases to function as a good heat and oxidation resistive coating layer.

The purpose of the present invention is to solve the aforementioned problems of the prior arts by presenting, first, a heat and oxidation resistive high strength material having a heat and oxidation resistive coating layer that has anti-thermal shock, anti-corrosion, and anti-oxidation properties along with excellent adhesive property to the surface of a heat resistive high strength substrate made of carbon and, second, a production method thereof.

SUMMARY OF THE INVENTION

In order to carry out the purpose mentioned above, the first feature of the present invention relates to a heat and oxidation resistive high strength material having a heat and oxidation resistive coating layer on a carbon substrate, comprising a SiC type coating on top of the carbon substrate, a $ZrO_2$ type ceramic coating on top of the SiC type coating, and an Ir type coating on top of the $ZrO_2$ type ceramic coating. In the SiC type coating, either the carbon concentration decreases continuously from the carbon substrate to the $ZrO_2$ type ceramic coating or a mixture layer of a SiC type coating material and a substrate material is formed between a part of the $ZrO_2$ type ceramic coating side and the carbon substrate.

The second feature of the present invention relates to a mixture layer of a SiC type coating material and a $ZrO_2$ type ceramic coating material formed between the SiC type coating and the $ZrO_2$ type ceramic coating of the first feature of the present invention.

The third feature of the present invention relates to the mixture layer of the SiC type coating material and the $ZrO_2$ type ceramic coating material of the second feature of the present invention in which the mixture ratio continuously changes from the SiC type coating towards the $ZrO_2$ type ceramic coating.

The fourth feature of the present invention relates to a mixture layer of a $ZrO_2$ type ceramic coating material and an Ir type coating material formed between the $ZrO_2$ type ceramic coating and the Ir type coating of the first feature of the present invention.

The fifth feature of the present invention relates to the mixture layer of the $ZrO_2$ type ceramic coating material and the Ir type coating material of the fourth feature of the present invention in which the mixture ratio continuously changes from the $ZrO_2$ type ceramic coating towards the Ir type coating.

The sixth feature of the present invention relates to the SiC type coating of the first, second, third, fourth, or fifth feature of the present invention comprising SiC as the main constituent with a part or a whole of the vacant space filled with $Al_2O_3$, $ZrO_2$, $Y_2O_3$, or $SiO_2$, or combinations thereof.

The seventh feature of the present invention relates to the $ZrO_2$ type ceramic coating of the first, second, third, fourth, fifth, or sixth feature of the present invention comprising $ZrO_2$ as the main constituent along with more than one from the group consisting of $Y_2O_3$, MgO, and CaO.

The eighth feature of the present invention relates to the carbon substrate of the first, second, third, fourth, fifth, sixth, or seventh feature of the present invention being made from a carbon fiber reinforced carbon.

The ninth feature of the present invention relates to a heat and oxidation resistive high strength material comprising a carbon substrate layered with a heat and oxidation resistive coating layer, which has a SiC type coating formed by a chemical vapor reaction method, and has a ZrC or a HfC coating formed by a chemical vapor deposition method, and has a $ZrO_2$ type ceramic coating layered on top of the ZrC or the HfC coating, and has an Ir type coating layered on top of the $ZrO_2$ type ceramic coating.

The tenth feature of the present invention relates to a method for producing a heat and oxidation resistive high strength material, which has a carbon substrate layered with a heat and oxidation resistive coating layer on the surface, comprising the steps of forming a SiC type coating on the surface of the carbon substrate, forming a $ZrO_2$ type ceramic coating on top of the SiC type coating, and forming an Ir type coating on top of the $ZrO_2$ type ceramic coating by an electron beam vapor deposition method.

The eleventh feature of the present invention relates to a method for producing a heat and oxidation resistive high strength material, which has a carbon substrate layered with a heat and oxidation resistive coating layer on the surface, comprising the steps of forming a SiC type coating on the surface of the carbon substrate, forming a $ZrO_2$ type ceramic coating on top of the SiC type coating, and forming an Ir type coating on top of the $ZrO_2$ type ceramic coating by using a method that uses simultaneously an electron beam vapor deposition method and ion beam irradiation.

The twelfth feature of the present invention relates to a method of the eleventh feature of the present invention, wherein the acceleration voltage of ion beam is within 1 to 50 kV and the main element that comprises the ion beam is either oxygen or argon.

The structure and the effect of the present invention will be described. In regard to the substrate of the super heat resistive composite material of the present invention, a carbon fiber reinforced carbon material is utilized, which is made of a matrix of carbons where carbon fibers fill the interstices. In placing this carbon fiber reinforced carbon material in the oxidative atmosphere at 2000° C. as an environmental induced damage and heat resistive material, reliability of the coating layer against environmental induced damage becomes a very important consideration. Important factors for this consideration are the heat resistivity, anti-oxidation ability, structural design, and adhesion. The following describes the coating layer of the present invention.

On top of the substrate of the carbon fiber reinforced carbon, a coating layer structure of the present invention form a heat resistive ceramic coating with excellent adhesion to the substrate and also a high melting point metallic coating with an oxygen barrier function on the surface layer exposed to the oxidative atmosphere. In this instance, a middle level layer ceramic coating has a reaction suppressing function on the heat resistive ceramic coating and the high melting point metallic coating.

SiC is a good choice in regard to the heat resistive ceramic coating formed on top of the substrate of the carbon fiber reinforced carbon, having excellent mechanical characteristics and chemical stability at high temperatures. This SiC coating is formed by the chemical vapor reaction method and the chemical vapor deposition method, depending on the function of purpose. That is, as SiC, which is formed on top of the substrate directly, needs to have a high adhesion force, the chemical vapor reaction method is used such that the metallic silicon vapor is reacted with and bonded to the carbon substrate, and this process produces SiC; thereby adhesion to the substrate can be promoted; and because the coating is a multiporous body, it is effective in relaxing thermal shocks. And by forming SiC above this layer by depositing SiC at the atomic level by the chemical vapor deposition method, fine and good crystal structures of high purity result, having excellent heat resistive characteristics. Moreover, this coating can be ZrC or HfC. Especially, in the case of forming a $ZrO_2$ coating on top of the ZrC coating, ZrC is desirable because it is compatible with the $ZrO_2$ coating. In this instance, it is desirable to form a SiC coating, which is compatible with the substrate of the carbon fiber reinforced carbon, by the chemical vapor reaction method and form ZrC or HfC on top of this coating by the chemical vapor deposition method. However, microcracks form across the thickness of the SiC coating, which is formed by the chemical vapor reaction method and the chemical vapor deposition method, because of thermal stress caused by the differences in thermal expansion between the substrate and the coating. Therefore, there is a possibility of oxygen penetrating into the substrate through these microcracks and damaging the substrate. For this reason, sealing the microcracks is effective in preventing penetration. Concerning the materials for this purpose, $Al_2O_3$, $ZrO_2$, $Y_2O_3$, or $SiO_2$ or combinations thereof, having heat resistivity, can be used. The filling process of these materials involves a sol/gel method; that is, it involves filling or painting TEOS, MAP, butoxyl zirconium, tetra-n-butoxyl zirconium, or tris-n-butoxyl yttrium into the cracks and firing the product. In this way, the SiC type coating can be produced which has excellent heat resistivity and great adhesion to the substrate of the carbon fiber reinforced carbon.

Next, for the surface of the high melting point metallic coating, in the case it is subjected to the oxidative atmosphere, Ir is desirable, in addition to being a high melting point metal that has excellent heat and oxidation resistivity at 2000° C., as it has the oxygen barrier function that prevents the impregnation of oxygen into the internal parts of the heat resistive ceramics coating or the carbon fiber reinforced carbon. That is, within the platinum metal VIII family, Os, Ir, and Ru have heat resistivity at 2000° C., but Ir has the highest melting point temperature among this group at 2447° C. and has the least amount of evaporative abrasion in the oxidative atmosphere. On the other hand, the other high melting point metals such as Ta, W, and Zr are subject to abrasion in the oxidative atmosphere or oxidative reaction, and hence, they are not desirable for the stated purpose of the present invention. From these, high melting point metal coating can be had, which has excellent heat and oxidation resistivity.

However, a coating structure, in which Ir of a high melting point metallic coating is directly placed on the SiC of a high heat resistive ceramic coating on top of the substrate, reacts to form IrSi, which has a low melting point of 1380° C., and therefore, the purpose of the present invention cannot be realized. For this reason, it is necessary to place a ceramic coating middle layer between SiC and Ir that does not react with either of these coatings at 2000° C. and that still has excellent heat and oxidative resistivity. In the present invention the purpose is accomplished by having a middle layer ceramic coating. That is, $ZrO_2$, which has a non-reactive function with either SiC or Ir and has heat resistivity, anti-thermal shock property, anti-oxidation property, and low thermal conduction as a ceramic, is selected. Additionally, it is effective to add $Y_2O_3$, MgO, or CaO as stabilizers in preventing phase change of $ZrO_2$.

On the other hand, $Al_2O_3$, the other representative ceramics, is extremely bad in terms of anti-thermal shock because of the phase change, $\alpha \leftrightarrows \gamma$. Furthermore, it is not appropriate for the purpose of the present invention because of its reaction with Ir. From these, the $ZrO_2$ type coating is found appropriate for its heat resistivity in conjunction with the SiC high heat resistivity ceramic coating and Ir high melting point metallic coating and for its non-reactive function.

Next, the method for producing the $ZrO_2$ type ceramic coating and the Ir type coating becomes an important consideration. That is, in consideration of violent thermal shocks and history of heating/cooling that can be received by the $ZrO_2$ type ceramic coating formed on top of the SiC type coating and by the Ir type coating formed on top of the $ZrO_2$ type ceramic coating, a coat forming technology of the present invention producing excellent adhesion at the interface of each coating is presented. Another feature of the coat forming technology of the present invention, in order to control thermal stress and the characteristics of each coating, is the excellent control of the elements in coating whereby various constituents are continuously changed easily from the surface to the inner surface and are not uniformly distributed within the coating.

As far as the coat forming technology is concerned, a method involving irradiating energy at the same time forming coating has been considered. After experimenting with various different energy sources for the vaporization process and for consistency, ion beam was determined to be best suited for the purpose. The method involves irradiating the substrate with an ion beam and vaporizing the $ZrO_2$ type or Ir type materials by the electron beam vapor deposition method, which is suitable for melting high melting point heat resistant ceramics. An ion beam is a high density energy source, but this energy must be applied only on the outermost surface. Therefore, by applying both an ion beam irradiation and deposition, even if the coating is formed at a low substrate temperature, in the case the energy of ion beam is adequately greater than the energy of the chemical compound production, the coating layer that is formed becomes a chemical compound. This is because the energy imparted by the irradiation of ion beam has the same effect as the preheating of the substrate to a high temperature for the instance of deposition. Furthermore, there is a feature that the constituents of this compound can be freely selected by controlling the quantity of deposition and the quantity of energy of the ion beam irradiation. Furthermore, extremely good adhesion can be obtained because of the formation of a mixing layer (a mixed layer of the formed layer compound and the elements of the substrate) by the injection of ions at the interface of the substrate or because of the formation of a single ion injection layer (few hundred Å).

Moreover, by controlling the acceleration voltage of the dynamic ion beam mixing, it becomes possible to produce a sputtering phenomenon associated with ion irradiation. Through this, sputtering cleaning can be conducted. Therefore, after cleaning the surface of the SiC type coating, if the $ZrO_2$ type coating is formed on top of it, the adhesion of the $ZrO_2$ type coating can be improved because there are no impurity at the interface.

As stated above, in regard to the production method of the present method invention, on top of the C/C substrate having a SiC type coating of several tens of microns to several hundreds of microns thick formed by the chemical vapor reaction method and the chemical vapor deposition method, first, an ion beam irradiation and a $ZrO_2$ type material deposition are conducted simultaneously to form a mixing layer. Second, the energy of ion beam is made small or reduced to zero and the $ZrO_2$ type material is deposited to form a fine $ZrO_2$ type ceramic coating.

After this, ion beam irradiation and Ir type material deposition are conducted simultaneously to form the mixing layer. Following this, the energy of ion beam is made small or reduced to zero and the Ir type material is deposited to form a fine Ir type coating.

By this production method of the present method invention, a mixing layer is formed between the SiC type coating and the $ZrO_2$ type ceramic coating, or between the $ZrO_2$ type ceramic coating and the Ir type coating, and an extremely good adhesion can be obtained even when the product is heated to a high temperature range.

The heat and oxidation resistive coating layer produced by the production method of the present method invention has a high reliability in terms of materials near the origin of destruction induced by thermal stress, and hence peeling associated with destruction is made difficult. Concerning the production method of the present method invention, it is desirable to have oxygen ions for ion beam. The reason for this is that, when the coating is heated to a high temperature and melted by the electron beam in the case for the $ZrO_2$ type material deposition, oxygen is released to form $ZrO_{2-x}$, and hence it is desirable to have an oxygen ion beam that can resupply the oxygen under the condition of obtaining $ZrO_2$ in as close to stoichiometric value as possible. Furthermore, as a reason for having the ion beam, in controlling the constituent of the $ZrO_2$ type ceramic coating and the Ir type coating, the speed of the response of the energy associated with the irradiation of ion beam can be noted. That is, when the ion beam is turned on, the energy becomes immediately suitable for coat forming, and when the ion beam is turned off or reduced, the energy is immediately extinguished. This type of rapid response is extremely difficult to achieve by the vacuum internal heating of a large structural product.

By the structure above, an environmentally induced damage resistant coating layer having excellent heat resistivity and adhesive property on the substrate of the carbon fiber reinforced carbon can be obtained.

For a better understanding of the above and other features and advantages of the invention, reference should be made to the following detailed description of preferred embodiments of the invention and to the accompanying drawings.

DESCRIPTION OF THE PREFERRED EMBODIMENTS

The following describes the embodiments of the present invention in concrete terms.
EMBODIMENT 1

Figure 1:
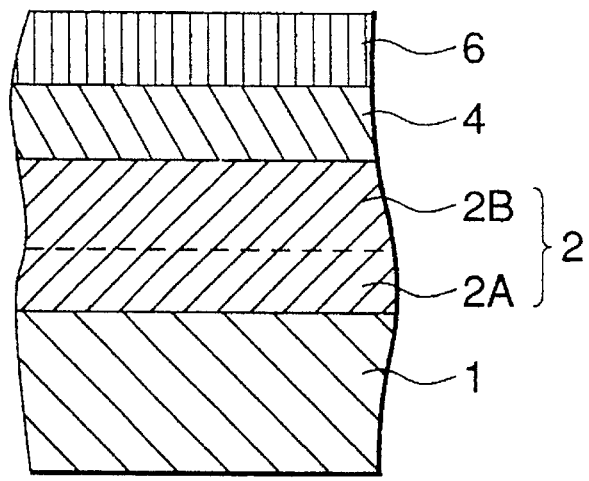
FIG. 1 illustrates a cross-sectional view of the heat and oxidation resistive high strength material of the present invention.

With a long fiber reinforced cross type carbon fiber reinforced type as a substrate, an environmentally induced damage resistant coating layer that is heat and oxidation resistant is formed as shown in FIG. 1. This environmentally induced damage resistant coating layer is made up of three coatings which are a SiC type coating 2, a $ZrO_2$ type coating 4, and an Ir coating 6. The dimension of the substrate 1 is 25 mm on the side and 5 mm in thickness, and the environmentally induced damage resistant coating layer is formed on the entire surface of this substrate 1.

First of all, the SiC type coating is formed after washing and drying the substrate 1. A SiC type coating 2A of 60 microns in thickness is formed by the chemical vapor reaction method with coke power at the processing temperature of 2000° C. and the surface residue is cleaned by honing. After washing and drying this substrate 1, 120 microns in average of a SiC type coating 2B is formed on top of the SiC type coating 2A by the plasma chemical vapor deposition method. The process requirements are that the processing gases, $SiCl_4$, $CH_4$, and $H_2$, be used at the processing temperature of 1400° C., the processing pressure be 4 Torr, the applied voltage be 1200 V, and the applied current be 10 A (discharge area approximately 3600 cm².

Following this, the $ZrO_2$ type coating 4 is formed on the surface of the substrate having the SiC type coating 2 by the ion beam mixing method comprising the ion beam source and the deposition source. The deposition source is the electron beam with the 10 kW output power. The material for the deposition source is $ZrO_2$-6% $Y_2O_3$ and the material for the ion beam source is oxygen ions. The coat formation

9 involves irradiating the surface of the SiC type coating 2 with an Ar ion beam (acceleration voltage 10 kV) and sputter cleaning the surface associated with the Ar ions. The pressure in the formation chamber in this case is $2\times10^{-5}$ Torr, and the temperature is set to 75° C. Following this, the passage of the gas of the ion beam source is closed and $ZrO_2$-6% $Y_2O_3$ is deposited. In this state, the thickness of the coating was brought to 70 microns by controlling the coating formation monitor. At this juncture, the pressure in the formation chamber is controlled to $5\times10^{-5}$ Torr and the substrate temperature is controlled to 1000° C. By this, a fine $ZrO_2$ type coating without pores or holes is made.

Following this, the Ir coating 6 is formed in the same process as described above on the surface of the substrate having the $ZrO_2$ type coating 4 and the SiC type coating 2. The coat formation involves irradiating the surface of the $ZrO_2$ type coating 4 with the oxygen ion beam (acceleration voltage 10 kV) and sputter cleaning the surface associated with the oxygen ions. The pressure in the formation chamber is $2\times10^{-5}$ Torr, and the temperature is set to 75° C. After this, the irradiation of the oxygen ions is stopped and Ir is deposited. In this state, the thickness is brought to 30 microns while monitoring with the coating formation monitor. At this juncture, the pressure in the formation chamber is controlled to $2\times10^{-5}$ Torr and the substrate temperature is controlled to 1000° C. By this, a fine Ir type coating 4 without pores is achieved.

An experiment was conducted involving heat and oxidation resistivity on the experimental substrate having the environmentally induced damage resistant coating layer, as described above. The experiment was conducted in the atmospheric heat chamber and the temperature was raised to 2000° C. for 25 minutes and then cooled naturally. The result was evaluated by a weight change after the experiment. The result showed that there was no apparent peeling upon visual inspection of the substrate with the environmentally induced damage resistant coating layer. The weight change was determined to be approximately 2 mg/cm$^2$, a very small amount. An experiment without the coating layer reduced the surface of the substrate to ash-like white.

The experiment indicated that the heat and oxidation resistive high strength material of the carbon fiber reinforced carbon having the environmentally induced damage resistant coating layer is extremely durable.

EMBODIMENT 2

Figure 2:
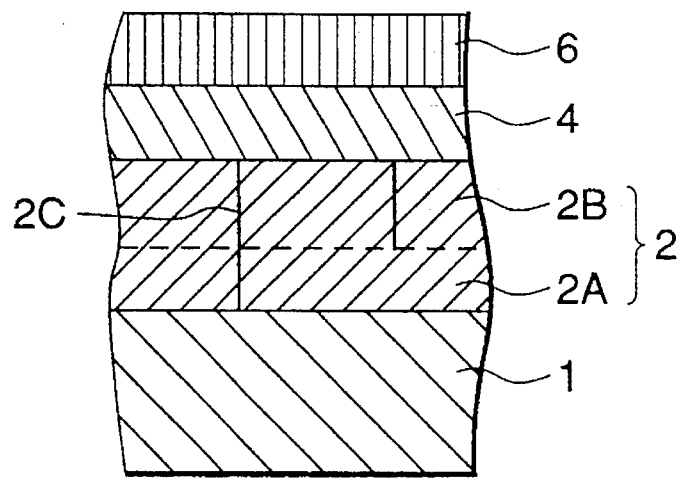
FIG. 2 illustrates a cross-sectional view of the heat and oxidation resistive high strength material of the present invention.

A SiC coating 2A and a SiC coating 2B is formed by the same method with the same specifications as in the embodiment 1. A visual inspection of this surface reveals several microcracks of 5 microns at maximum. Hence, these microcracks are sealed after the SiC coating is formed. The sealing involves using TEOS and MAP; the product is submerged into these liquids, and after about 100 mg of weight increase is incorporated, it is heated at a low temperature of 400° C. in air, and following this, it is heated at a high temperature of 1000° C. From these processes, a SiC type coating 2 comprising the SiC coating 2A, the SiC coating 2B, and the microcrack seal 2C is made, as shown in FIG. 2.

Then, on top of the SiC type coating 2, a $ZrO_2$ type coating 4 and an Ir coating 6 are formed by the same method with the same specifications as in the embodiment 1. This test product was tested for durability, as in the embodiment 1, and the result was the same as in the embodiment 1. This experiment indicated that the heat and oxidation resistive high strength material of the carbon fiber reinforced carbon having the environmentally induced damage resistant coating layer is extremely durable.

10

EMBODIMENT 3

Figure 3:
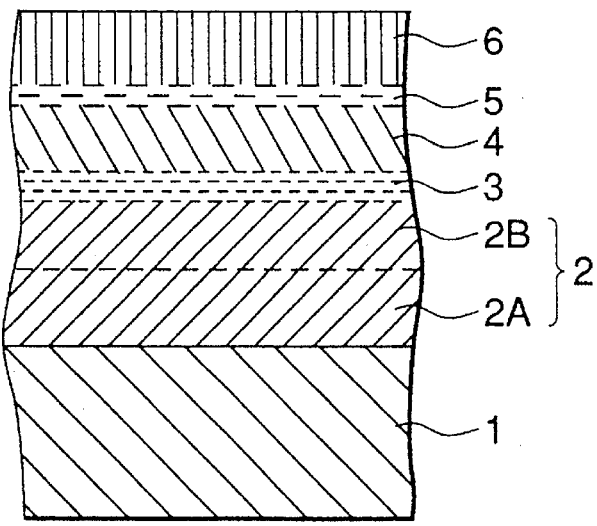
FIG. 3 illustrates a cross-sectional view of the heat and oxidation resistive high strength material of the present invention.

An environmentally induced damage resistant coating layer having resistance to heat and oxidation is formed as shown in FIG. 3. A SiC type coating 2 is formed by the same method with the same specifications as in the embodiment 2. After this, this test product is irradiated by an Ar ion beam (acceleration voltage 10 kV) and the surface according to the Ar ion is sputter cleaned. The pressure inside the coating chamber is $2\times10^{-5}$ Torr at this point and the substrate temperature is 75° C. After this, the source for the ion beam is changed to oxygen, an oxygen ion beam (acceleration voltage 10 kV) is irradiated on the test product while depositing $ZrO_2$-6%$Y_2O_2$. At this situation, the deposition and the irradiation are conducted and by monitoring the coating thickness, the thickness is made to 70 microns. At this stage, the internal pressure of the coat forming chamber is $8\times10^{-5}$ Tort and the temperature is controlled to 1000° C. By this, a mixing layer 3 having a mixture of SiC of the SiC type coating surface and $ZrO_2$-6%$Y_2O_3$ of the deposition material is formed, and the thickness of this layer is measured to be 0.1 micron. On top of this layer, 70 microns of a $ZrO_2$-6%$Y_2O_3$ layer is formed. In this way a fine $ZrO_2$ type coating 4 that does not have pores is constructed.

Then, an Ir coating 6 is formed on the surface of the product that has the SiC type coating 2 and the $ZrO_2$ type coating 4. First of all, an oxygen ion beam (acceleration voltage 10 kV) is irradiated on the surface of the $ZrO_2$ type coating 4, and the surface according to the oxygen ions is sputter cleaned. At this point, the pressure inside the coating chamber is $2\times10^{-5}$ Torr and the substrate temperature is 75° C. Following this, Ir is deposited while irradiating the surface with the oxygen ions. The coating thickness is monitored to a thickness of about 0.5 micron by irradiating and depositing. After this, the gas passage for the ion beam source is shut off, and only the Ir deposition is conducted. In this situation, the thickness was increased to 30 microns by monitoring the thickness formation. At this stage, the internal pressure of the coat forming chamber is $3\times10^{-5}$ Torr and the temperature is controlled to 1000° C. By this, a mixing layer 5 of a mixture of $ZrO_2$ and Ir of the deposition material is formed on top of the $ZrO_2$ type coating surface, and the thickness of this particular layer is made to about 0.1 micron. On top of this, an Ir coating of 30 microns is formed, and a fine Ir type coating 4 without pores is achieved.

Figure 5:
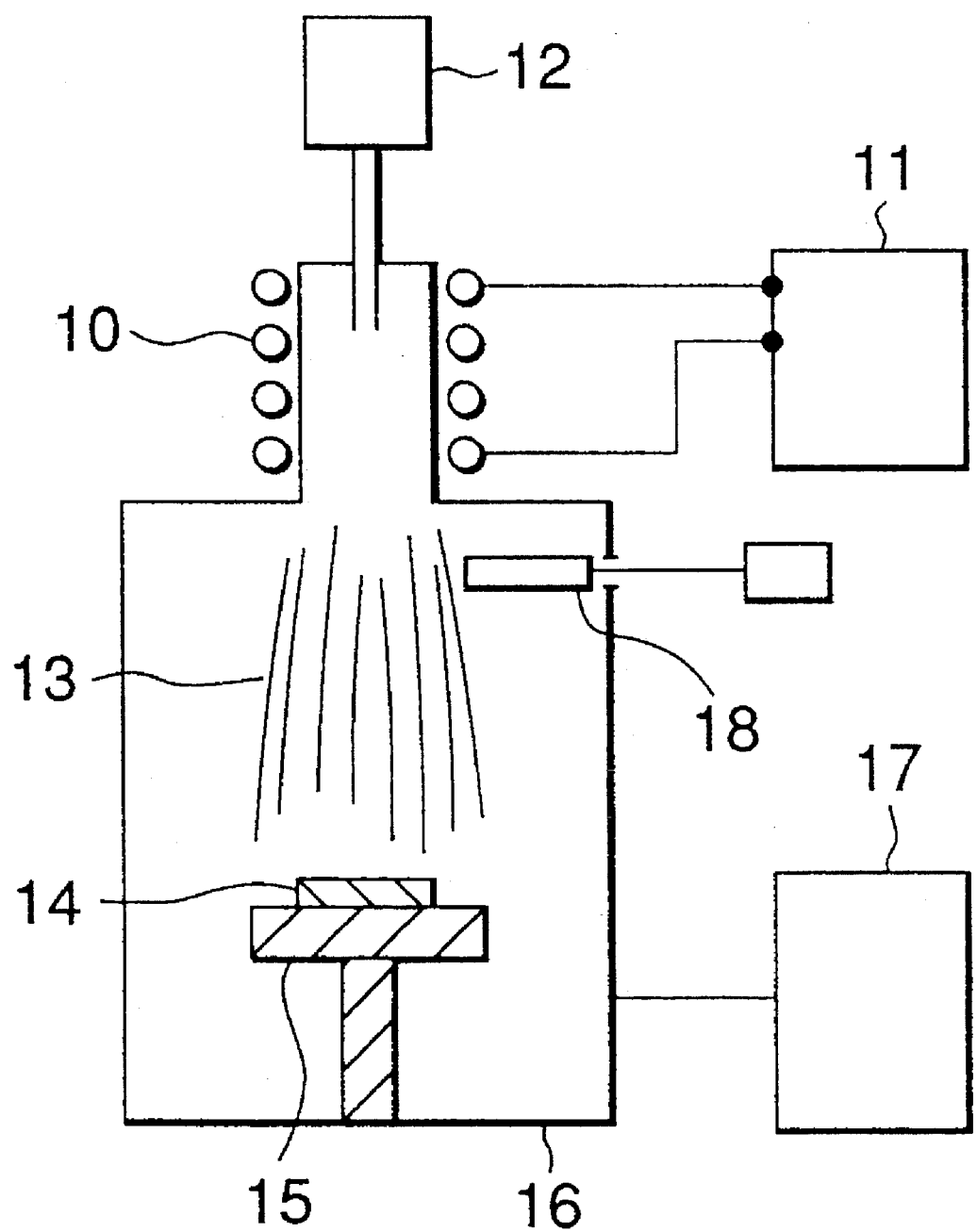
FIG. 5 is a schematic of a high frequency thermal plasma irradiation instrument for the oxidation experiment.

An experiment was performed on this test product to test for its durability by using the high frequency induced thermal plasma irradiation instrument shown in FIG. 5. Concerning FIG. 5, the test product 14 is fixed on a holding fixture 15, and this is placed inside a closed vessel 16 which is evacuated by a vacuum pump 17. By a high frequency electricity source 11 and a high frequency coil 10, the atmospheric gas supplied by a gas supply control system 12 is excited to generate a thermal plasma 13, and this is irradiated on the test product 14. The number 18 designates a shutter. This instrument has a high frequency electricity source of 50 kW output, and supplies oxygen to produce oxygen plasma, and inside this instrument the test product 14 is placed and is heated for 20 minutes at a temperature between 1300° C. and 2000° C. The result was evaluated by the change in weight. The result showed that there was no apparent peeling upon visual inspection of the substrate covered with the environmentally induced damage resistant coating layer even when the test product was subjected to a temperature between 1300° C. and 2000° C. On the other hand, a test product covered with a SiC coating ($SiO_2$ seal) of the prior art remained protected up to the temperature of 1700° C., but at 2000° C., holes started to form and there were damages to the substrate of the carbon fiber reinforced carbon. Furthermore, there were weight reductions by 3 mg/cm$^2$ at 1300° C. and by 15 mg/cm$^2$ at 2000° C.

This indicates that the heat and oxidation resistive high strength material of the carbon fiber reinforced carbon having the environmentally induced damage resistant coating layer is extremely durable at high temperatures.

EMBODIMENT 4

Figure 4:
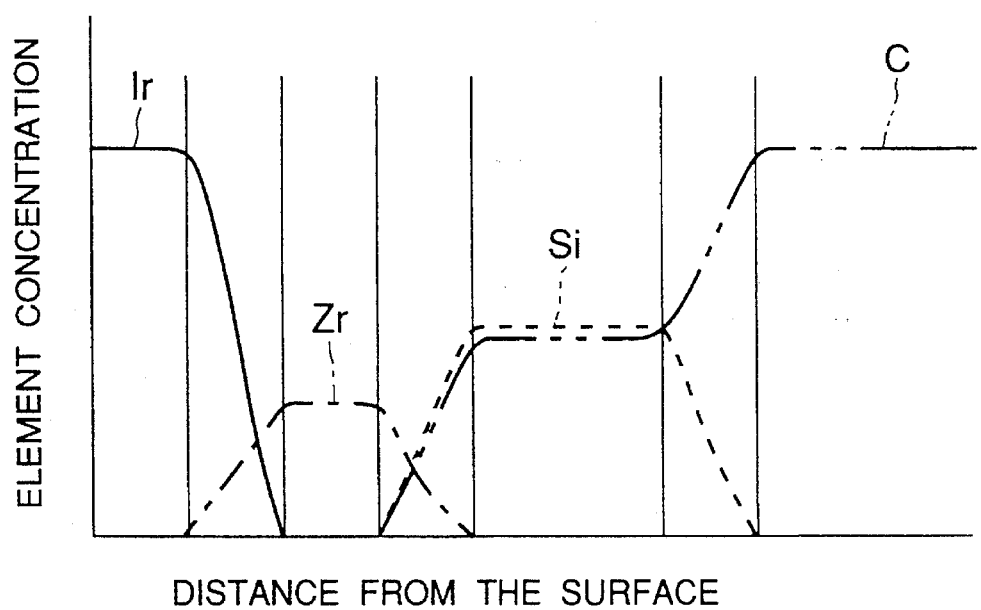
FIG. 4 shows a graph which indicates the constituent density of the heat and oxidation resistive high strength material of the present invention.

As shown in FIG. 4, an environmentally induced damage resistant coating layer of heat and oxidation resistivity is formed. A SiC type coating 2 is formed by the same method with the same specifications as in the embodiment 2. After this, this test product is irradiated by an Ar ion beam (acceleration voltage 10 kV) and the surface according to the Ar ion is sputter cleaned. The pressure inside the coating formation chamber is 2×10$^{-5}$ Torr at this point and the substrate temperature is 75° C. After this, the source for the ion beam is changed to methane, and a carbon ion beam (acceleration voltage 10 kV) is irradiated on the test product while depositing SiC. In this situation, the deposition and the irradiation are simultaneously conducted and by monitoring the coating thickness, the thickness is made to 5 microns. Following this, as the deposition quantity of SiC is continuously decreased, and as the deposition quantity of $ZrO_2$-6%$Y_2O_3$ is continuously increased, the beam scanning of electron beam is controlled to form a gradient element coating of 10 microns having the quantity of SiC and $ZrO_2$-6%$Y_2O_3$ continuously changing inversely over the thickness. Furthermore, only the deposition of $ZrO_2$-6%$Y_2O_3$ and the irradiation of the oxygen ion beam are simultaneously conducted to build up a $ZrO_2$ coating of 50 microns. At this stage, the internal pressure of the coat forming chamber is 8×10$^{-5}$ Torr and the temperature is controlled to 1000° C. By this, the gradient element coating, which has a continuous changing mixture of $ZrO_2$-6%$Y_2O_3$ of the deposition material and SiC of the SiC type coating surface, and the $ZrO_2$-6%$Y_2O_3$ only layer are formed. And these fine layers are devoid of holes or pores.

After this, as the deposition quantity of $ZrO_2$-6%$Y_2O_3$ is continuously decreased, and as the deposition quantity of Ir is continuously increased, the beam scanning of electron beam is controlled to form a gradient element coating of 10 microns having the quantity of $ZrO_2$-6%$Y_2O_3$ and the quantity of Ir continuously changing inversely over the thickness. Following this, only Ir is deposited to build up an Ir coating of 30 microns. At this stage, the internal pressure of the coat forming chamber is 3×10$^{-5}$ Torr and the temperature is controlled to 1000° C. By this, the gradient element coating, which has a continuous changing mixture of $ZrO_2$-6%$Y_2O_3$ of the deposition material and the Ir only coating are formed. And these fine layers are devoid of holes or pores.

The durability of this test product was tested in a similar manner as in the embodiment 3. In this instance, the thermal plasma 13 shut off by the shutter 18 is opened to rapidly raise the temperature of the test product 14 for imparting thermal shock to the coating layer. The surface temperature was raised to 2000° C. in 30 seconds. The result of the experiment revealed no peeling of the coating layer. And the weight change in this instance was the same as in the embodiment 3.

In this way, the heat and oxidation resistive high strength material of the carbon fiber reinforced carbon having the environmentally induced damage resistant coating layer is shown to be extremely durable at high temperatures.

EMBODIMENT 5

Figure 6:
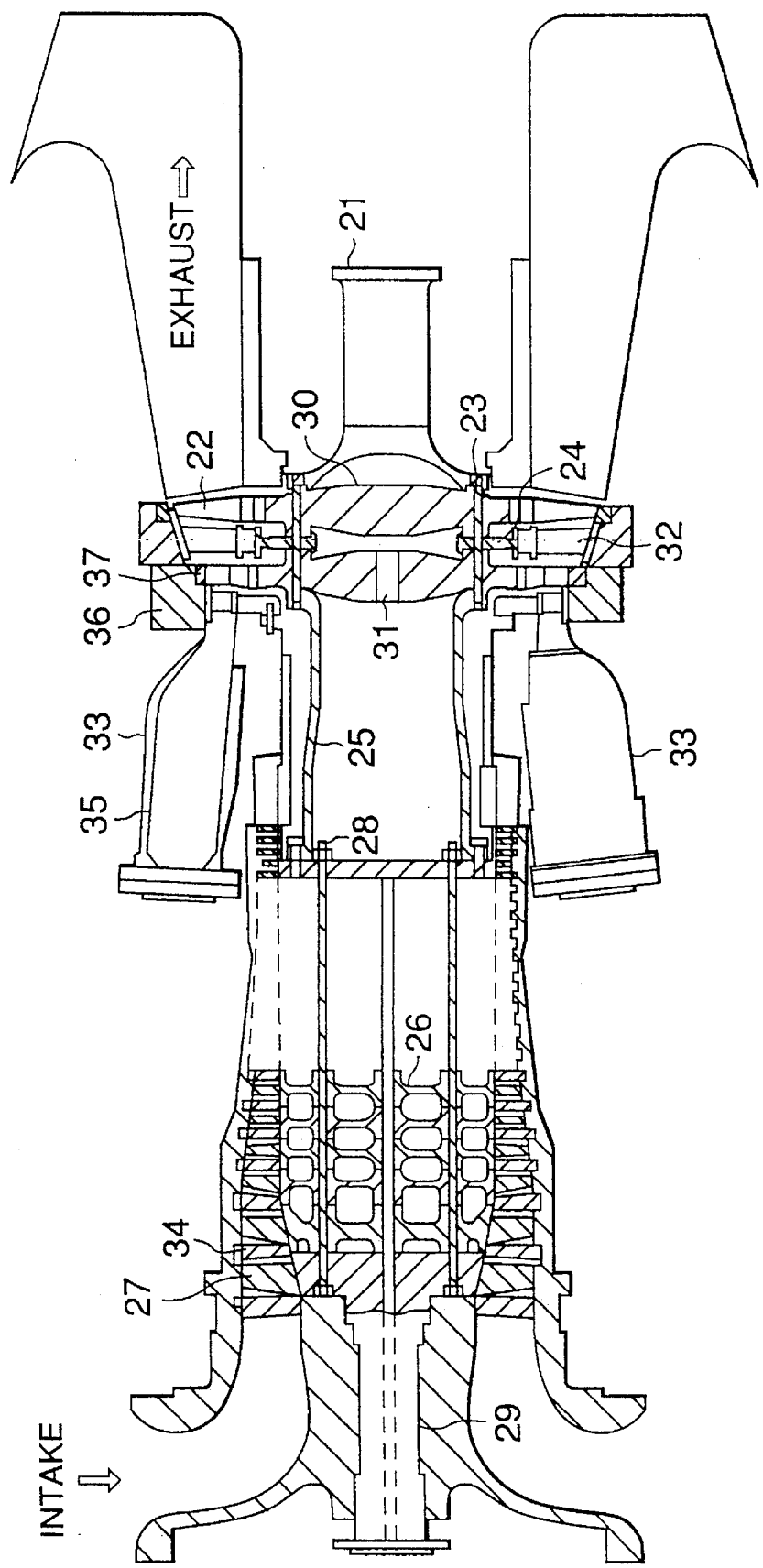
FIG. 6 indicates a cross-sectional view of the structure of a gas turbine.

FIG. 6 shows an example of the land machine composite material of the present invention utilized in a rotational part and the surrounding parts of a gas turbine shown in a cross-sectional view. The numeral 21 indicates a turbine disc, 22 a turbine blade, 23 a turbine stocking, 24 a turbine spacer, 25 a distant piece, 26 a compressor disc, 27 a compressor blade, 28 a compressor stocking bolt, 29 a compressor stub shaft, 30 a turbine disc, 31 a central hole, 32 a turbine nozzle, 33 a combustor, 34 a compressor nozzle, 35 a liner, 36 a diaphragm, and 37 a shroud.

Figure 7:
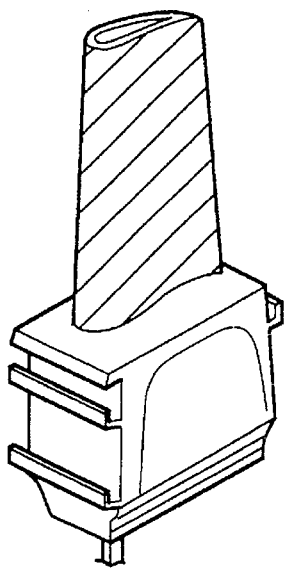
FIG. 7 is an expanded view of a part of the turbine blade of FIG. 6.

FIG. 7 shows the detail of the turbine blade 22 of FIG. 6, and in the present embodiment, this turbine blade is made of the heat and oxidation resistive high strength material of the embodiment 1 of the present invention.

Because the turbine blade is abraded by the burning gas, the surface of the blade is raised to an extremely high temperature. The turbine of the prior art is made of metallic material or metallic material coated with ceramic; and to reduce the temperature of the blade, it is cooled by compressed air.

The cooling method involves suspending the inner structure of the turbine and cooling the inner structure, and after this, directing a cooled air from the end of the blade to the burning gas, and furthermore, cooling in a film like manner the outer surface of the gas turbine that is abraded by the burning gas blowing out from the small holes on the surface of the turbine blade. Because these procedures necessitate a large amount of compressed air, they invite inefficiency of the turbine.

Moreover, because the cooling means is directed toward the burning gas, this lowers the temperature of the burning gas. In the case of the turbine blade of the present embodiment, the outer surface of the turbine blade that is subject to abrasion by the burning gas is made from the carbon fiber reinforced carbon which has high heat strength as well as excellent durability. That is, the carbon fiber reinforced carbon of the substrate of the turbine blade is a long fiber chain structure (three dimensional structure) of determined construction that is a matrix of long carbon fiber chains; and on this surface, the part indicated by the slanted line in FIG. 7, the heat and oxidation resistive coating layer of the present invention is placed. The result of burning the turbine model based on this gas turbine blade 22 for 100 hours (at the burning gas temperature of 1200° C.) showed no damages on the environmentally induced damage resistant coating layer, and hence, no damages were detected on the carbon fiber reinforced carbon of the substrate.

In this way, cooling like in a film manner of the material surface torched with the burning gas is not necessary because the gas turbine blade of the heat and oxidation resistive high strength material has excellent thermal resistivity.

Therefore, in comparison with the turbine blade of the prior art, the turbine blade of the present embodiment causes no reduction of the burning gas temperature, and because the usage of the amount of compressed air can be reduced, efficiency of the turbine is not sacrificed.

EMBODIMENT 6

Figure 8:
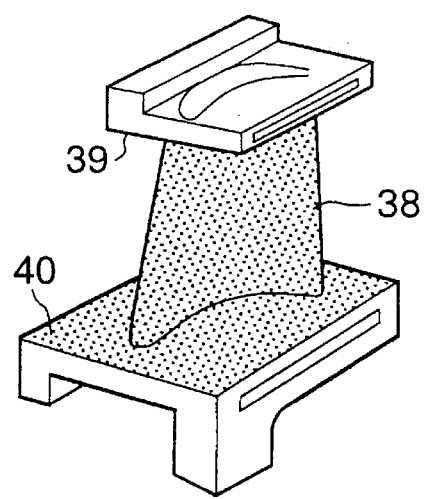
FIG. 8 is an expanded view of a part of the turbine blade of FIG. 6.

FIG. 8 shows the detail of the turbine nozzle 32 of FIG. 6. In this present embodiment, this turbine nozzle is made with the heat and oxidation resistive high strength material of the present invention featured in the embodiment 2. The carbon fiber reinforced carbon that is to be the basis for the turbine nozzle is a long fiber chain structure (three dimensional structure) of determined construction that is a mesh of long carbon fiber chains, and the heat and oxidation resistive coating layer of the present invention is placed on the blade surface 38 indicated by the mesh part in FIG. 8 and the gas pass parts 39 and 40. The result of burning the turbine model based on this gas turbine nozzle for 100 hours (at the burning gas temperature of 1200° C.) showed no damages on the environmentally induced damage resistant coating layer, and hence, no damages were detected on the carbon fiber reinforced carbon of the substrate.

EMBODIMENT 7

Figure 9:
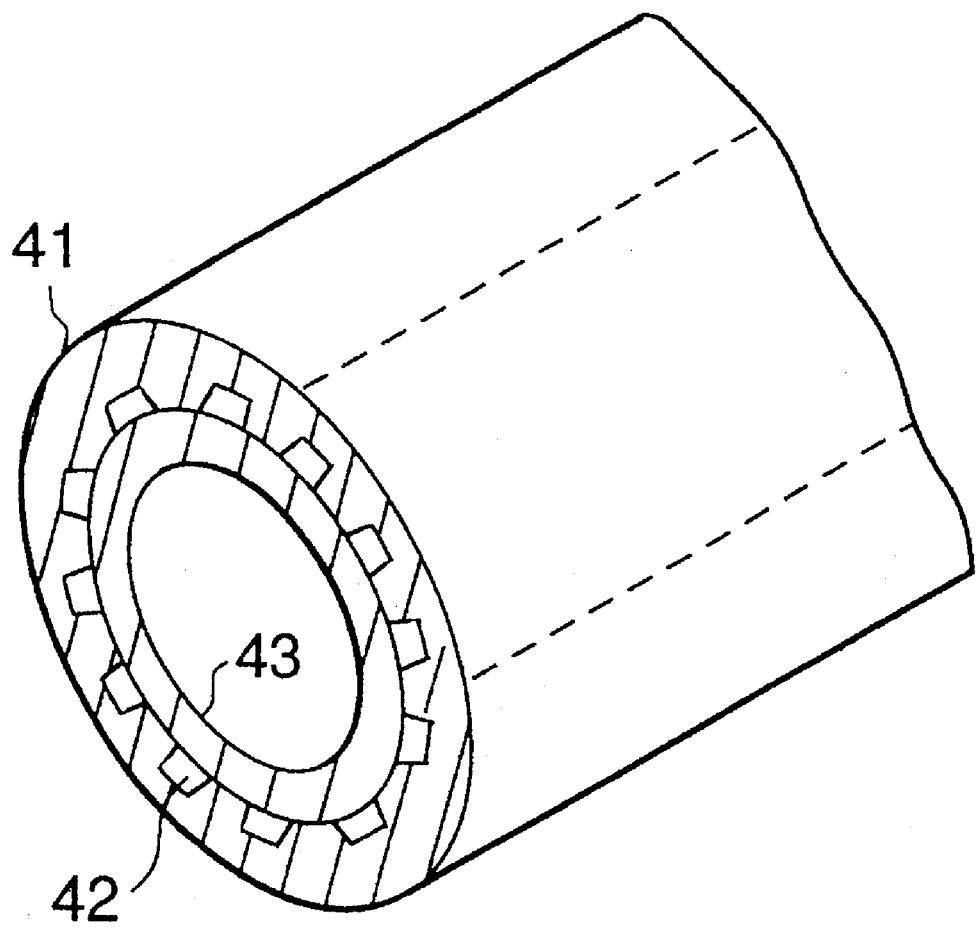
FIG. 9 is an expanded view of a part of the combustor of FIG. 6.

FIG. 9 shows a cross-sectional view of a combustor part of the combustor 33 shown in FIG. 6, which is constructed with the heat and oxidation resistive high strength material of the present invention. Burning occurs inside the cylindrical structure of the combustor part. Therefore, the inside of the combustor part is subject to high temperature abrasion. The combustor part of the prior art, having metallic structure, is cooled by compressed air to reduce the high temperature. However, this invites cooling of the burning gas because this method introduces cooling means into the burning gas. However, in the case of the combustor part structure of the present embodiment, it is not necessary to employ cooling in a film like manner of the surface torched by the burning gas because the surface is coated by the heat and oxidation resistive high strength material, which has excellent thermal and oxidation resistivity. Furthermore, by blowing in compressed air into the space 42 between the structure 41 of Ni based thermal resistant alloy and the heat and oxidation resistive high strength material 43, the constructed structure can be more effectively cooled, and there is no need to mix compressed air with the burning gas.

Therefore, in comparison with the turbine blade of the prior art, the turbine blade of the present embodiment causes no substantial reduction of the burning gas temperature.

CONCLUSION

The heat and oxidation resistive high strength material of the present invention does not crack or peel even in the high temperature/oxidative atmosphere since it is made in the manner as described above. Also, in accordance with the present method invention, the production of the heat and oxidation resistive high strength material of special characteristics can be facilitated.

Furthermore, according to the heat and oxidation resistive high strength material and the light weight heat resistive material under thereof, the product coated with these materials are extremely strong against high temperatures.

Moreover, according to the light weight heat and oxidation resistive high strength product of the present invention which has an open space for cooling, since it is possible to flow in cooling means into the open space in the high temperature/oxidation atmosphere, a reduction of the temperature of the structure can be achieved and durability can be increased.

We claim:

1. A heat and oxidation resistant high strength material comprising a heat and oxidation resistive coating layer on top of a carbon substrate; wherein said heat and oxidation resistive coating layer comprises a SiC type coating fixed on top of said carbon substrate, a $ZrO_2$ type ceramic coating placed on top of said SiC type coating, and an Ir type coating placed on top of said $ZrO_2$ type ceramic coating.

2. The heat and oxidation resistive high strength material of claim 1 further comprising a mixed layer of a SiC type coating material and a $ZrO_2$ type ceramic coating material between said SiC type coating and said $ZrO_2$ type ceramic coating.

3. The heat and oxidation resistive high strength material of claim 2, wherein the ratio of mixture of said mixed layer of said SiC type coating material and said $ZrO_2$ type ceramic coating material changes continuously from said SiC type coating to said $ZrO_2$ type ceramic coating.

4. The heat and oxidation resistive high strength material of claim 1 further comprising a mixed layer of a $ZrO_2$ type ceramic coating material and an Ir type coating material between said $ZrO_2$ type ceramic coating and said Ir type coating.

5. The heat and oxidation resistive high strength material of claim 4, wherein the ratio of mixture of said mixed layer of said $ZrO_2$ ceramic type coating material and said Ir type coating material changes continuously from said $ZrO_2$ ceramic type coating to said Ir type coating.

6. The heat and oxidation resistive high strength material of claim 1, wherein said SiC type coating material has SiC as the main constituent and has a part or a whole of the vacant space filled with ceramics of $Al_2O_3$, $ZrO_2$, $Y_2O_3$, or $SiO_2$, or combinations thereof.

7. The heat and oxidation resistive high strength material of claim 2, wherein said SiC type coating material has SiC as the main constituent and has a part or a whole of the vacant space filled with ceramics of $Al_2O_3$, $ZrO_2$, $Y_2O_3$, or $SiO_2$, or combinations thereof.

8. The heat and oxidation resistive high strength material of claim 3, wherein said SiC type coating material has SiC as the main constituent and has a part or a whole of the vacant space filled with ceramics of $Al_2O_3$, $ZrO_2$, $Y_2O_3$, or $SiO_2$, or combinations thereof.

9. The heat and oxidation resistive high strength material of claim 4, wherein said SiC type coating material has SiC as the main constituent and has a part or a whole of the vacant space filled with ceramics of $Al_2O_3$, $ZrO_2$, $Y_2O_3$, or $SiO_2$, or combinations thereof.

10. The heat and oxidation resistive high strength material of claim 5, wherein said SiC type coating material has SiC as the main constituent and has a part or a whole of the vacant space filled with ceramics of $Al_2O_3$, $ZrO_2$, $Y_2O_3$, or $SiO_2$, or combinations thereof.

11. The heat and oxidation resistive high strength material of claim 1, wherein said $ZrO_2$ type ceramic coating consists of $ZrO_2$ as the main constituent and more than one from the group consisting of $Y_2O_3$, MgO, and CaO.

12. The heat and oxidation resistive high strength material of claim 2, wherein said $ZrO_2$ type ceramic coating consists of $ZrO_2$ as the main constituent and more than one from the group consisting of $Y_2O_3$, MgO, and CaO.

13. The heat and oxidation resistive high strength material of claim 3, wherein said $ZrO_2$ type ceramic coating consists of $ZrO_2$ as the main constituent and more than one from the group consisting of $Y_2O_3$, MgO, and CaO.

14. The heat and oxidation resistive high strength material of claim 4, wherein said $ZrO_2$ type ceramic coating consists of $ZrO_2$ as the main constituent and more than one from the group consisting of $Y_2O_3$, MgO, and CaO.

15. The heat and oxidation resistive high strength material of claim 5, wherein said $ZrO_2$ type ceramic coating consists of $ZrO_2$ as the main constituent and more than one from the group consisting of $Y_2O_3$, MgO, and CaO.

16. The heat and oxidation resistive high strength material of claim 6, wherein said $ZrO_2$ type ceramic coating consists of $ZrO_2$ as the main constituent and more than one from the group consisting of $Y_2O_3$, MgO, and CaO.

17. The heat and oxidation resistive high strength material of claim 7, wherein said $ZrO_2$ type ceramic coating consists of $ZrO_2$ as the main constituent and more than one from the group consisting of $Y_2O_3$, MgO, and CaO.

18. The heat and oxidation resistive high strength material of claim 8, wherein said $ZrO_2$ type ceramic coating consists of $ZrO_2$ as the main constituent and more than one from the group consisting of $Y_2O_3$, MgO, and CaO.

19. The heat and oxidation resistive high strength material of claim 9, wherein said $ZrO_2$ type ceramic coating consists of $ZrO_2$ as the main constituent and more than one from the group consisting of $Y_2O_3$, MgO, and CaO.

20. The heat and oxidation resistive high strength material of claim 10, wherein said $ZrO_2$ type ceramic coating consists of $ZrO_2$ as the main constituent and more than one from the group consisting of $Y_2O_3$, MgO, and CaO.

21. The heat and oxidation resistive high strength material of claim 1, wherein said carbon substrate is a carbon fiber reinforced carbon.

22. The heat and oxidation resistive high strength material of claim 2, wherein said carbon substrate is a carbon fiber reinforced carbon.

23. The heat and oxidation resistive high strength material of claim 3, wherein said carbon substrate is a carbon fiber reinforced carbon.

24. The heat and oxidation resistive high strength material of claim 4, wherein said carbon substrate is a carbon fiber reinforced carbon.

25. The heat and oxidation resistive high strength material of claim 5, wherein said carbon substrate is a carbon fiber reinforced carbon.

26. The heat and oxidation resistive high strength material of claim 6, wherein said carbon substrate is a carbon fiber reinforced carbon.

27. The heat and oxidation resistive high strength material of claim 7, wherein said carbon substrate is a carbon fiber reinforced carbon.

28. The heat and oxidation resistive high strength material of claim 8, wherein said carbon substrate is a carbon fiber reinforced carbon.

29. The heat and oxidation resistive high strength material of claim 9, wherein said carbon substrate is a carbon fiber reinforced carbon.

30. The heat and oxidation resistive high strength material of claim 10, wherein said carbon substrate is a carbon fiber reinforced carbon.

31. The heat and oxidation resistive high strength material of claim 11, wherein said carbon substrate is a carbon fiber reinforced carbon.

32. The heat and oxidation resistive high strength material of claim 12, wherein said carbon substrate is a carbon fiber reinforced carbon.

33. The heat and oxidation resistive high strength material of claim 13, wherein said carbon substrate is a carbon fiber reinforced carbon.

34. The heat and oxidation resistive high strength material of claim 14, wherein said carbon substrate is a carbon fiber reinforced carbon.

35. The heat and oxidation resistive high strength material of claim 15, wherein said carbon substrate is a carbon fiber reinforced carbon.

36. The heat and oxidation resistive high strength material of claim 16, wherein said carbon substrate is a carbon fiber reinforced carbon.

37. The heat and oxidation resistive high strength material of claim 17, wherein said carbon substrate is a carbon fiber reinforced carbon.

38. The heat and oxidation resistive high strength material of claim 18, wherein said carbon substrate is a carbon fiber reinforced carbon.

39. The heat and oxidation resistive high strength material of claim 19, wherein said carbon substrate is a carbon fiber reinforced carbon.

40. The heat and oxidation resistive high strength material of claim 20, wherein said carbon substrate is a carbon fiber reinforced carbon.

41. A heat and oxidation resistive high strength material comprising a carbon substrate layered with a heat and oxidation resistive coating layer, which has a SiC type coating formed by a diffusion reactiovt method or, in other words, a CVR method, and has a ZrC or a HfC coating formed by a chemical vapor deposition method or, in other words, a CVD method, and has a $ZrO_2$ type ceramic coating layered on top of said ZrC or said HfC coating, and has an Ir type coating layered on top of said $ZrO_2$ type ceramic coating.

* * * * *